(12) United States Patent
Tojima et al.

(10) Patent No.: US 11,626,361 B2
(45) Date of Patent: Apr. 11, 2023

(54) POWER SEMICONDUCTOR MODULE

(71) Applicant: KYOCERA Corporation, Kyoto (JP)

(72) Inventors: Takashi Tojima, Hadano (JP); Yasushi Nemoto, Hadano (JP); Tsutomu Morita, Hadano (JP); Atsushi Ochiya, Hadano (JP)

(73) Assignee: KYOCERA Corporation, Kyoto (JP)

( * ) Notice: Subject to any disclaimer, the term of this patent is extended or adjusted under 35 U.S.C. 154(b) by 214 days.

(21) Appl. No.: 17/055,699

(22) PCT Filed: May 16, 2019

(86) PCT No.: PCT/JP2019/019564
§ 371 (c)(1),
(2) Date: Nov. 16, 2020

(87) PCT Pub. No.: WO2019/221242
PCT Pub. Date: Nov. 21, 2019

(65) Prior Publication Data
US 2021/0210421 A1 Jul. 8, 2021

(30) Foreign Application Priority Data
May 17, 2018 (JP) .............................. JP2018-095022

(51) Int. Cl.
| H01L 23/12 | (2006.01) |
| H01L 23/498 | (2006.01) |
| H01L 23/373 | (2006.01) |
| H01L 23/40 | (2006.01) |
| H01L 23/00 | (2006.01) |

(Continued)

(52) U.S. Cl.
CPC .... *H01L 23/49827* (2013.01); *H01L 23/3735* (2013.01); *H01L 23/4006* (2013.01); *H01L 23/49838* (2013.01); *H01L 24/48* (2013.01); *H01L 24/49* (2013.01); *H01L 25/072* (2013.01); *H01L 25/18* (2013.01); *H01L 2023/4068* (2013.01); *H01L 2224/48225* (2013.01); *H01L 2224/49175* (2013.01)

(58) Field of Classification Search
CPC combination set(s) only.
See application file for complete search history.

(56) References Cited

U.S. PATENT DOCUMENTS

| 8,637,981 B2 * | 1/2014 | Hauenstein | G01K 1/16 257/469 |
| 2014/0374629 A1 * | 12/2014 | Huang | H01L 24/40 250/551 |
| 2018/0247885 A1 * | 8/2018 | Kinyanjui | H01L 23/49568 |

FOREIGN PATENT DOCUMENTS

| JP | 10-139928 A | 5/1998 |
| JP | 2000-183279 A | 6/2000 |

(Continued)

*Primary Examiner* — Niki H Nguyen
(74) *Attorney, Agent, or Firm* — Volpe Koenig

(57) ABSTRACT

A power semiconductor module includes an insulating substrate, conductor patterns and a power semiconductor element. The conductor patterns are formed on both surfaces of the insulating substrate. The power semiconductor element is mounted on the conductor patterns. The conductor patterns include an anode terminal connection portion and a cathode terminal connection portion. A circuit is formed such that a current that flows between the anode terminal connection portion and the cathode terminal connection portion via the power semiconductor element flows on the both surfaces of the insulating substrate.

11 Claims, 8 Drawing Sheets

(51) Int. Cl.
*H01L 25/07* (2006.01)
*H01L 25/18* (2023.01)

(56) References Cited

FOREIGN PATENT DOCUMENTS

| | | |
|---|---|---|
| JP | 2010-258315 A | 11/2010 |
| JP | 2014-038982 A | 2/2014 |
| JP | 2015-103540 A | 6/2015 |
| JP | 2017-108187 A | 6/2017 |

* cited by examiner

- - - ▶ : CURRENT PATH

POWER SEMICONDUCTOR MODULE

TECHNICAL FIELD

The present disclosure relates to a power semiconductor module.

BACKGROUND ART

As described in Patent Literatures 1 and 2, there is known, as a conventional power semiconductor module, a power semiconductor module configured such that a circuit including power semiconductor elements (3A, 3B) and conductor patterns (2P, 2N, 2AC) is formed on the upper surface of an insulating substrate (1), and a conductor pattern (2K) on the lower surface of the insulating substrate is connected to a heat-dissipating metal(s), such as a metal plate 8 and/or a heat-dissipating fin component 9, via solder (10C).

CITATION LIST

Patent Literature

Patent Literature 1: JP 2017-108187 A
Patent Literature 2: JP 2015-103540 A

SUMMARY OF INVENTION

A first aspect of the present disclosure is a power semiconductor module including:

an insulating substrate;

conductor patterns formed on both surfaces of the insulating substrate; and a power semiconductor element mounted on the conductor patterns, wherein the conductor patterns include an anode terminal connection portion and a cathode terminal connection portion, and wherein a circuit is formed such that a current that flows between the anode terminal connection portion and the cathode terminal connection portion via the power semiconductor element flows on the both surfaces of the insulating substrate.

A second aspect of the present disclosure is a power semiconductor module including:

an insulating substrate;

conductor patterns formed on both surfaces of the insulating substrate; and a power semiconductor element mounted on the conductor patterns, wherein an anode terminal connection portion and a cathode terminal connection portion of the conductor patterns are disposed at one end of the insulating substrate, and wherein a circuit is formed such that a current that flows between the anode terminal connection portion and the cathode terminal connection portion via the power semiconductor element reaches an opposite surface by turning at an end opposite to the one end, thereby flowing on a front and a back of the insulating substrate in directions opposite to one another.

A third aspect of the present disclosure is a power semiconductor module including:

an insulating substrate;

conductor patterns formed on both surfaces of the insulating substrate;

a power semiconductor element mounted on the conductor patterns; and a heat-dissipating metal, wherein the power semiconductor element is mounted over one surface of the insulating substrate, and the conductor pattern on a surface opposite to the one surface is connected to the heat-dissipating metal via an insulating layer, and wherein the conductor pattern on the opposite surface is in contact with one surface of the insulating layer, and the heat-dissipating metal is in contact with the other surface.

DESCRIPTION OF EMBODIMENTS

Hereinafter, embodiments of the present disclosure will be described with reference to the drawings.

First Embodiment

First, a first embodiment of the present disclosure will be described with reference to FIG. 1A, FIG. 1B and FIG. 1C.

Figure 1A:
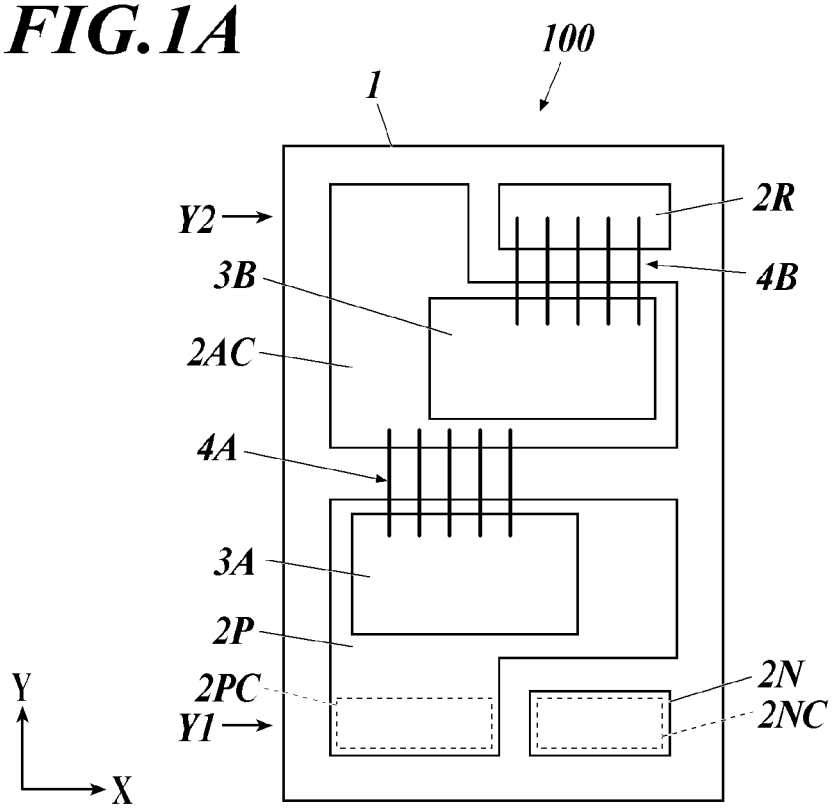
FIG. 1A is a plan view of a circuit board of a power semiconductor module according to a first embodiment of the present disclosure.
Figure 1B:
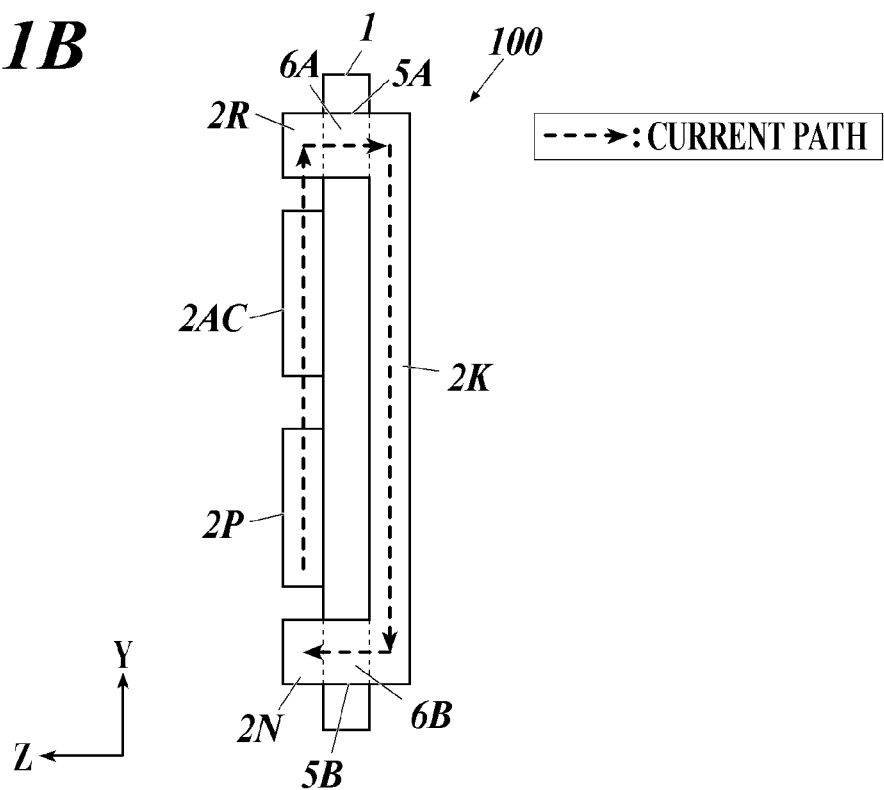
FIG. 1B is a cross-sectional view of the circuit board of the power semiconductor module according to the first embodiment of the present disclosure.
Figure 1C:
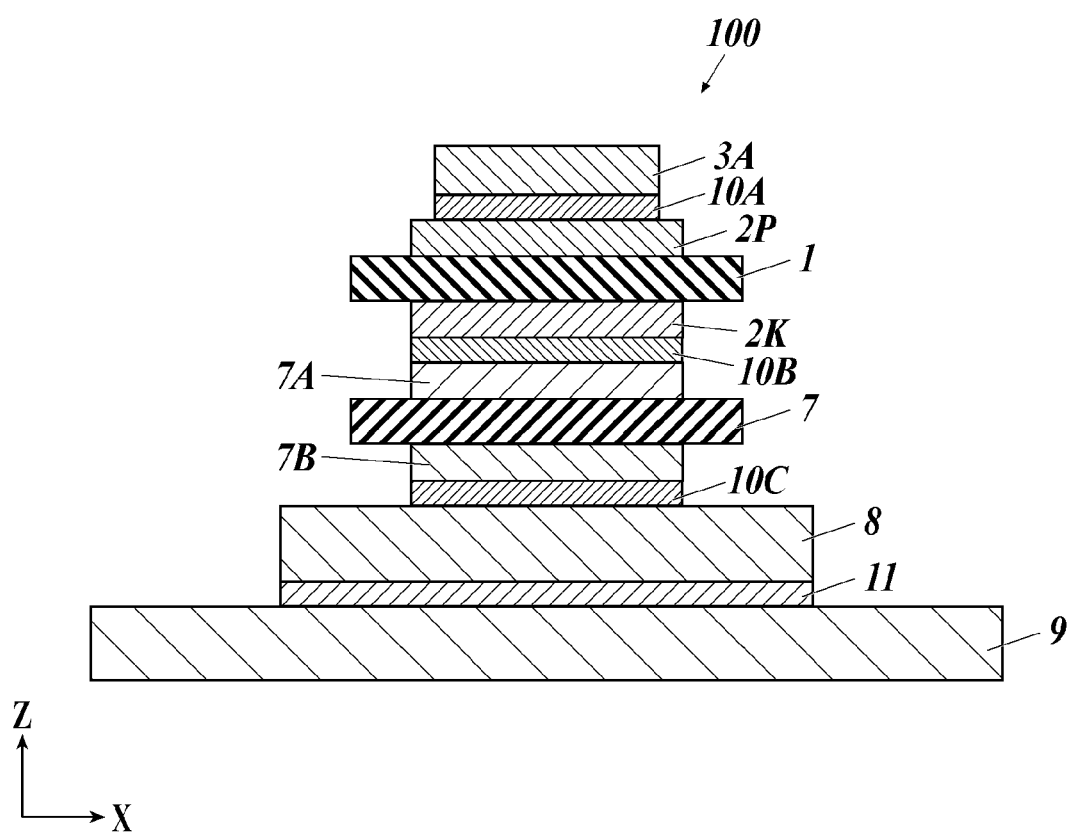
FIG. 1C is a cross-sectional view of the main part of the power semiconductor module according to the first embodiment of the present disclosure.

As shown in FIG. 1A, FIG. 1B and FIG. 1C, a power semiconductor module 100 of this embodiment includes an insulating substrate 1, conductor patterns 2P, 2N, 2AC, 2R formed on the upper surface of the insulating substrate 1, a power semiconductor element 3A mounted on the conductor pattern 2P by bonding, and a power semiconductor element 3B mounted on the conductor pattern 2AC by bonding.

The power semiconductor elements 3A, 3B are power semiconductor elements such as IGBTs or MOSFETs, and the power semiconductor module 100 of this embodiment corresponds to a power converter that converts direct current into single-phase alternating current.

The conductor pattern 2P is an anode pattern having an anode terminal connection portion 2PC and a bonding region for the power semiconductor element 3A. An external lead anode terminal is connected to the anode terminal connection portion 2PC. The conductor pattern 2N is a cathode pattern having a cathode terminal connection portion 2NC. An external lead cathode terminal is connected to the cathode terminal connection portion 2NC. An external lead terminal for AC output is connected to the conductor pattern 2AC.

A lower-surface electrode of the power semiconductor element 3A is electrically connected to the conductor pattern 2P.

An upper-surface electrode of the power semiconductor element 3A is electrically connected to the conductor pattern 2AC by a bonding wire(s) 4A.

A lower-surface electrode of the power semiconductor element 3B is electrically connected to the conductor pattern 2AC.

An upper-surface electrode of the power semiconductor element 3B is electrically connected to the conductor pattern 2R by a bonding wire(s) 4B.

The power semiconductor module 100 of this embodiment further includes a conductor pattern 2K formed on the lower surface of the insulating substrate 1, a conductive material 6A disposed in a through hole 5A formed in the insulating substrate 1, and a conductive material 6B disposed in a through hole 5B formed in the insulating substrate 1.

By the conductive material 6A, the conductor pattern 2R and the conductor pattern 2K are electrically connected.

By the conductive material 6B, the conductor pattern 2K and the conductor pattern 2N are electrically connected.

The conductive materials 6A, 6B may be conductive substances with which the through holes 5A, 5B are filled or conductive substances with which the inner surfaces of the through holes 5A, 5B are plated.

The insulating substrate 1 is a rectangle with one end as the short side. The long-side direction is represented by Y, and the short-side direction is represented by X. The thickness direction is represented by Z. The anode terminal connection portion 2PC and the cathode terminal connection portion 2NC are disposed at one end Y1 in the long-side direction Y of the insulating substrate 1.

A current path on the upper surface of the insulating substrate 1 is formed, from the one end Y1 to the opposite end Y2 (in the positive direction of the Y axis), by the conductor pattern 2P, the power semiconductor element 3A, the bonding wire 4A, the conductor pattern 2AC, the power semiconductor element 3B, the bonding wire 4B and the conductor pattern 2R.

At the opposite end Y2, the current path turns thanks to the conductor pattern 2R, the conductive material 6A and the conductor pattern 2K, thereby reaching the opposite surface. A current path on the lower surface of the insulating substrate 1 is formed, from the opposite end Y2 to the one end Y1 (in the negative direction of the Y axis), by the conductor pattern 2K.

The directions of the current paths are as indicated by dashed arrows.

As described above, in the power semiconductor module 100, a circuit is formed such that a current that flows between the anode terminal connection portion 2PC and the cathode terminal connection portion 2NC via the power semiconductor elements 3A, 3B reaches the opposite surface by turning at the end Y2 opposite to the one end Y1, thereby flowing on the front and the back of the insulating substrate 1 in directions opposite to one another.

The offset effect by the current flowing in the opposite directions that are parallel reduces inductance. Further, because the insulating substrate 1 is long in the Y direction, and accordingly a section for the current to flow in the opposite directions that are parallel is long, the effect of reducing inductance can be high.

The power semiconductor module 100 of this embodiment further includes, as shown in FIG. 1C, a connecting insulating substrate 7, a metal plate 8 and a heat-dissipating fin component 9. The connecting insulating substrate 7 has a joining conductor pattern 7A and a joining conductor pattern 7B formed on the upper surface and the lower surface, respectively.

The lower surface of the power semiconductor element 3A (3B) is joined to the conductor pattern 2P (2AC) with a conductive adhesive 10A, such as solder.

The conductor pattern 2K on the lower surface of the insulating substrate 1 is joined to the conductor pattern 7A on the upper surface of the connecting insulating substrate 7 with a conductive adhesive 10B, such as solder. By being united with the conductor pattern 2K, the conductor pattern 7A and the conductive adhesive 10B are also the current path.

The conductor pattern 7B on the lower surface of the connecting insulating substrate 7 is joined to the upper surface of the metal plate 8 with an adhesive 10C, such as solder. The connecting insulating substrate 7 electrically insulates the metal plate 8 from the circuit.

The lower surface of the metal plate 8 is joined to the upper surface (flat surface) of the heat-dissipating fin component 9 via thermal grease 11. The heat-dissipating fin component 9 has fin(s) on its lower side.

As described above, the power semiconductor module 100 has a structure in which the power semiconductor elements 3A, 3B are mounted over one surface (upper surface) of the insulating substrate 1, and the conductor pattern 2K on the opposite surface (lower surface) of the insulating substrate 1 is connected to the heat-dissipating metals (8, 9) via the insulating layer (7).

According to the power semiconductor module 100 of the first embodiment, in addition to the above-described reduction of inductance, the following effects are obtained.

When a current path is configured by routing a wiring on the upper surface of the insulating substrate 1 for a current to flow in the opposite directions that are parallel, the insulating substrate 1 needs to have a large area.

According to the power semiconductor module 100 of the first embodiment, because a necessary circuit area can be divided between the two surfaces of the insulating substrate 1, the insulating substrate 1 can have a small area, and the power semiconductor module can be miniaturized accordingly.

Further, because the two layers of the current paths are disposed on the front and the back of the insulating substrate 1, the two layers are not stacked on one surface of the insulating substrate 1, and the power semiconductor module can be miniaturized thanks to lower height.

Second Embodiment

Figure 2A:
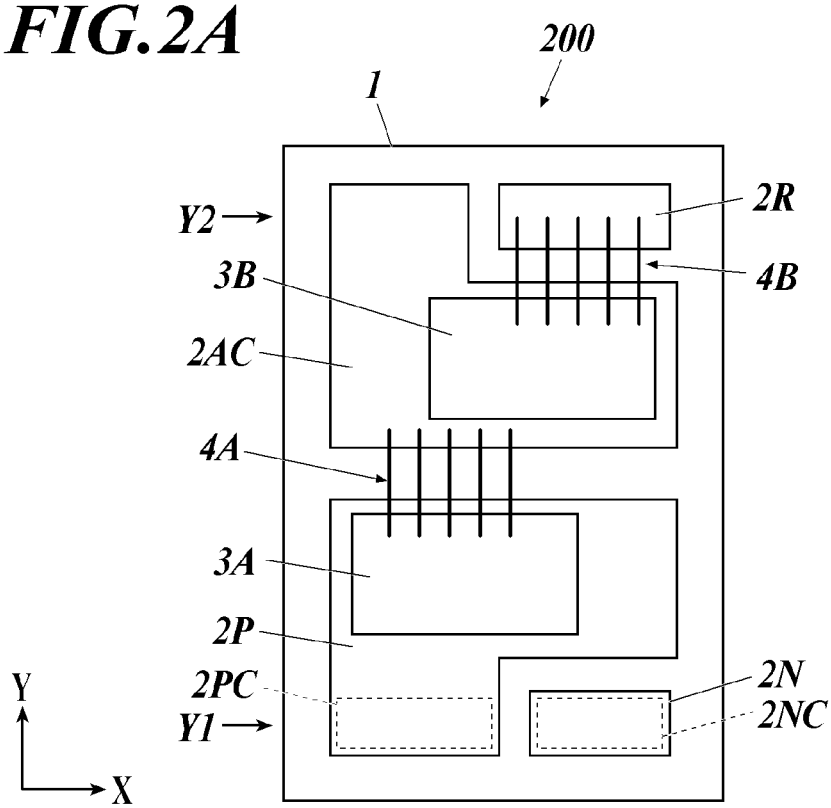
FIG. 2A is a plan view of a circuit board of a power semiconductor module according to a second embodiment of the present disclosure.
Figure 2B:
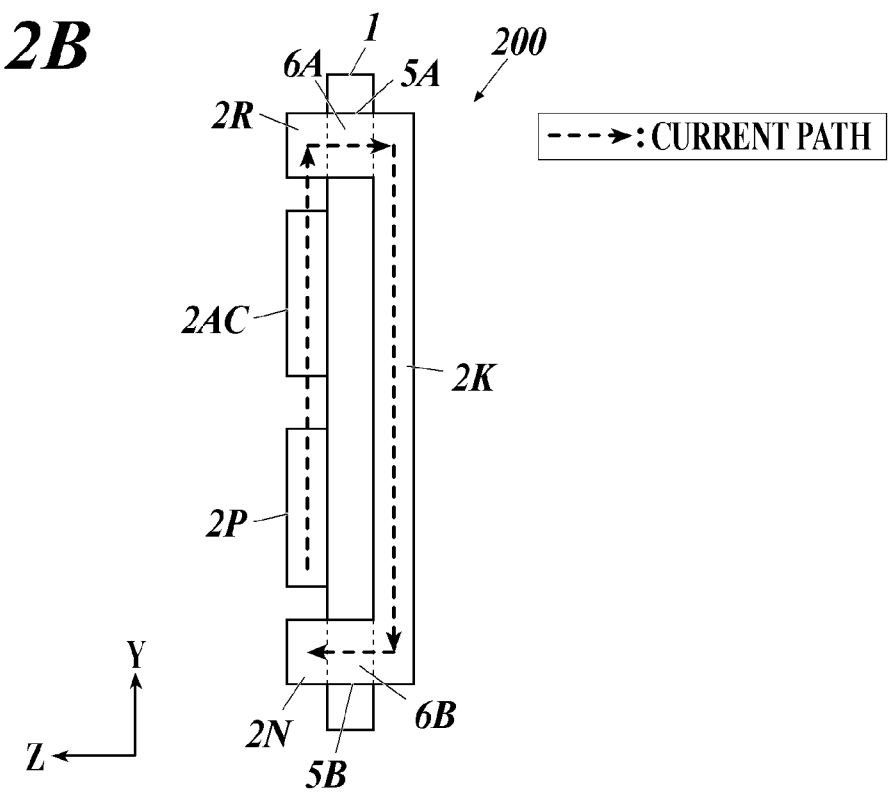
FIG. 2B is a cross-sectional view of the circuit board of the power semiconductor module according to the second embodiment of the present disclosure.
Figure 2C:
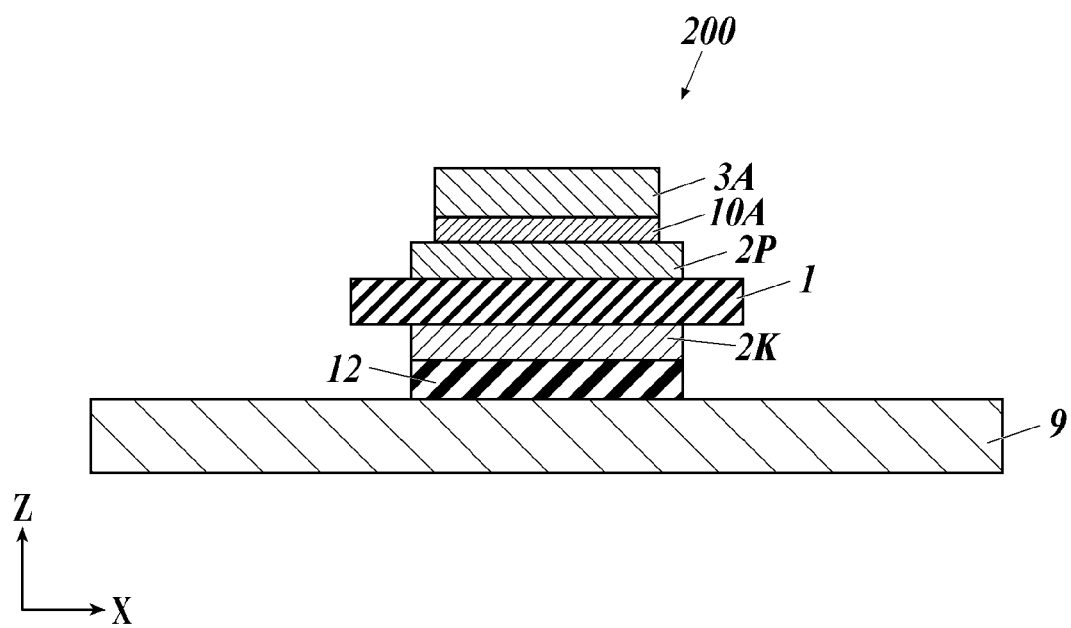
FIG. 2C is a cross-sectional view of the main part of the power semiconductor module according to the second embodiment of the present disclosure.

Next, a second embodiment of the present disclosure will be described with reference to FIG. 2A, FIG. 2B and FIG. 2C.

In the conventional example and the first embodiment, multiple layers are interposed between the insulating substrate 1 and the heat-dissipating fin component 9.

In contrast, a power semiconductor module 200 of this embodiment is configured by replacing the stacked layers of the conductive adhesive 10B, the conductor pattern 7A, the connecting insulating substrate 7, the conductor pattern 7B, the adhesive 10C, the metal plate 8 and the thermal grease 11 in the first embodiment with a single layer of an insulating layer 12.

Hence, the conductor pattern 2K on the lower surface of the insulating substrate 1 is connected to the heat-dissipating metal (9) via the insulating layer 12, the upper surface of the insulating layer 12 is in contact with the conductor pattern 2K on the lower surface of the insulating substrate 1, and the lower surface of the insulating layer 12 is in contact with the heat-dissipating metal (9).

Thus, there is one layer between the conductor pattern 2K and the heat-dissipating fin component 9, which archives the miniaturization due to the lower height, and also improves heat dissipation owing to the closeness of the heat-dissipating fin component 9 to the circuit.

The effect of the lower height is effectively obtained as a matter of course even when the circuit is completed on the upper surface of the insulating substrate 1 and the lower surface of the insulating substrate 1 is not used as a circuit layer.

As the insulating layer 12, an insulating high thermal conductive resin material is used. A high thermal conductive resin material is resin containing filler (thermal conductive filler) having a higher thermal conductivity than the resin, thereby enhancing thermal conductivity. Selecting insulating filler makes resin insulating. Examples of the resin include silicone, polyamide, epoxy and polyphenylene sulfide (PPS). Examples of the filler include alumina, silica and boron nitride, which are insulators and have a high thermal conductivity.

Modified Embodiments, etc.

In the first embodiment and the second embodiment, the conductor patterns on the both surfaces of the insulating substrate 1 are electrically connected to one another via the conductive materials 6A, 6B disposed in the through holes 5A, 5B, but may be connected as follows.

That is, as shown in FIG. 3A, FIG. 3B and FIG. 3C or FIG. 4A and FIG. 4B, the conductor patterns on the both surfaces of the insulating substrate 1 are electrically connected to one another via conductive materials (13A, 13B or 14A, 14B) disposed outside the edge of the insulating substrate 1.

Figure 3A:
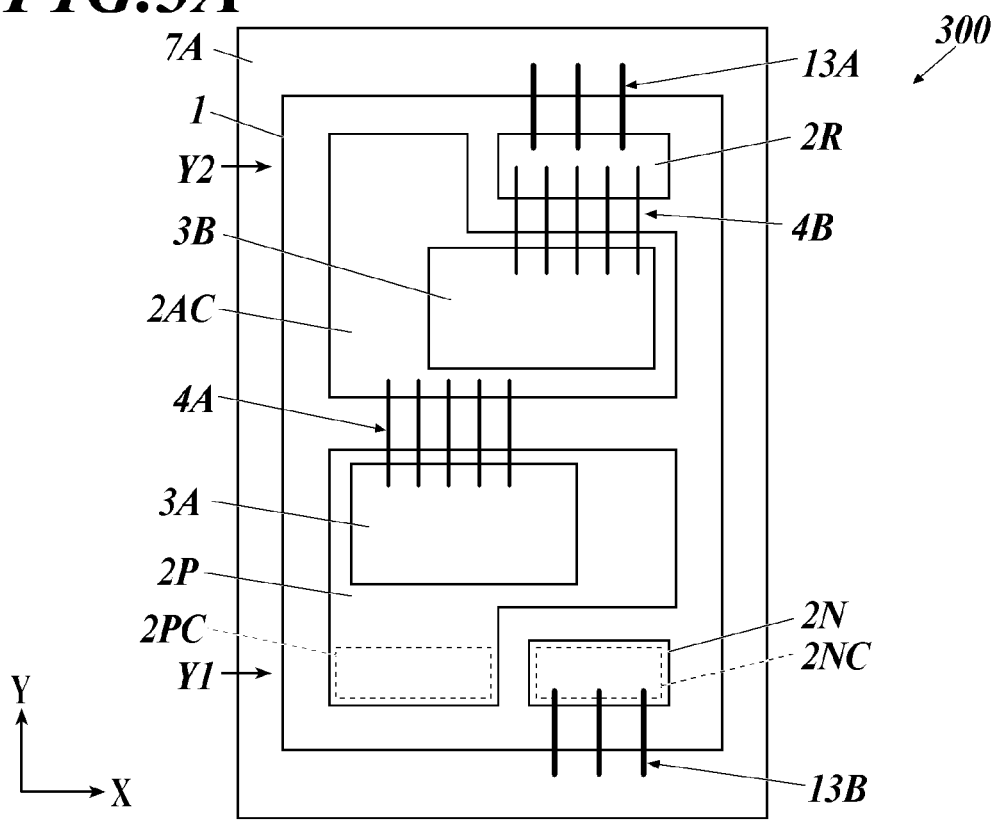
FIG. 3A is a plan view of a circuit board of a power semiconductor module according to a modified embodiment of the present disclosure.
Figure 3B:
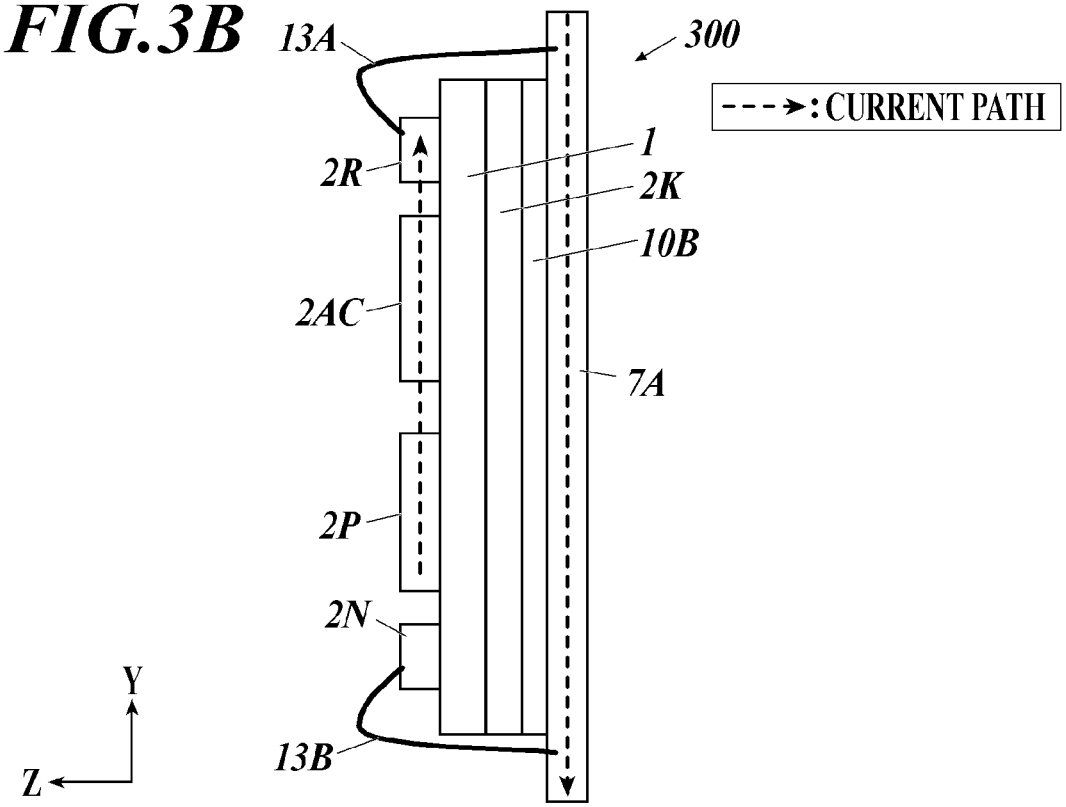
FIG. 3B is a side view of the circuit board of the power semiconductor module according to the modified embodiment of the present disclosure.
Figure 3C:
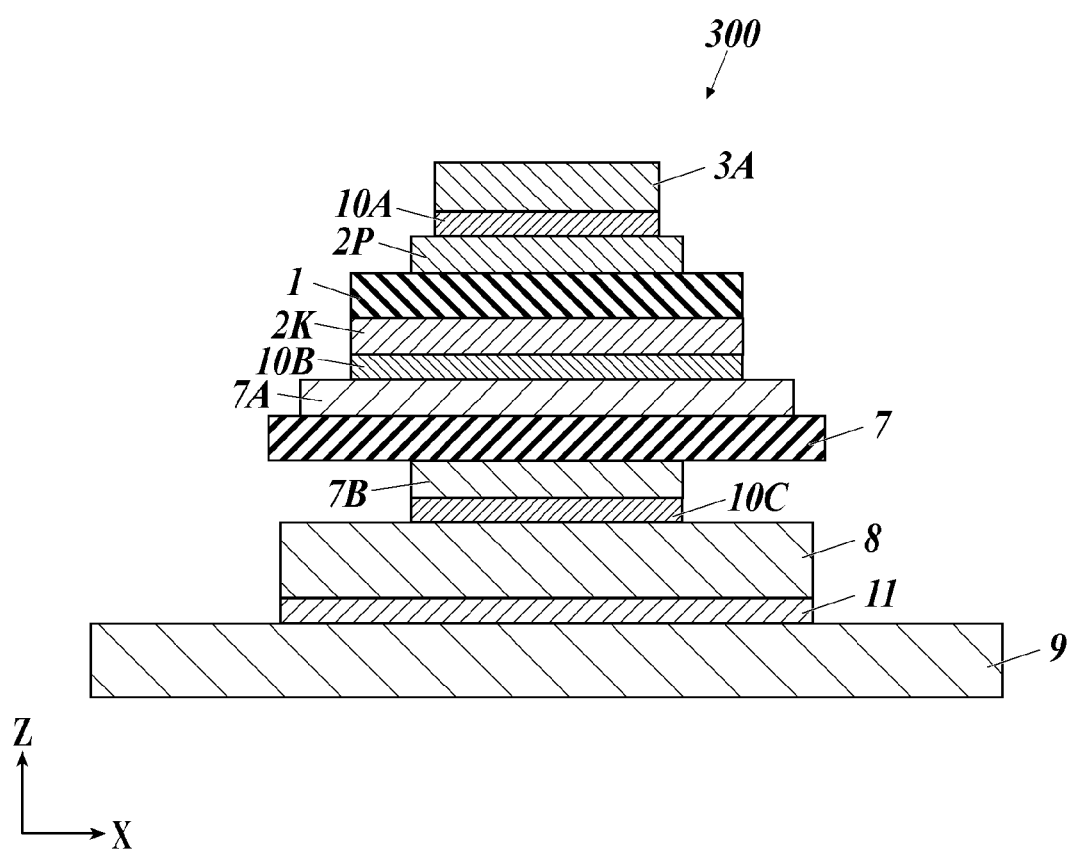
FIG. 3C is a cross-sectional view of the main part of the power semiconductor module according to the modified embodiment of the present disclosure.

A power semiconductor module 300 shown in FIG. 3A, FIG. 3B and FIG. 3C is configured by using bonding wires 13A, 13B as the conductive materials that connect the front and the back of the insulating substrate 1. For example, wire bonding regions are ensured by the connecting insulating substrate 7 and the conductor pattern 7A on the upper surface thereof each having a larger area than the insulating substrate 1, and the conductor pattern 2R is connected to the conductor pattern 7A by the bonding wire(s) 13A, and the conductor pattern 7A is connected to the conductor pattern 2N by the bonding wire(s) 13B.

Figure 4A:
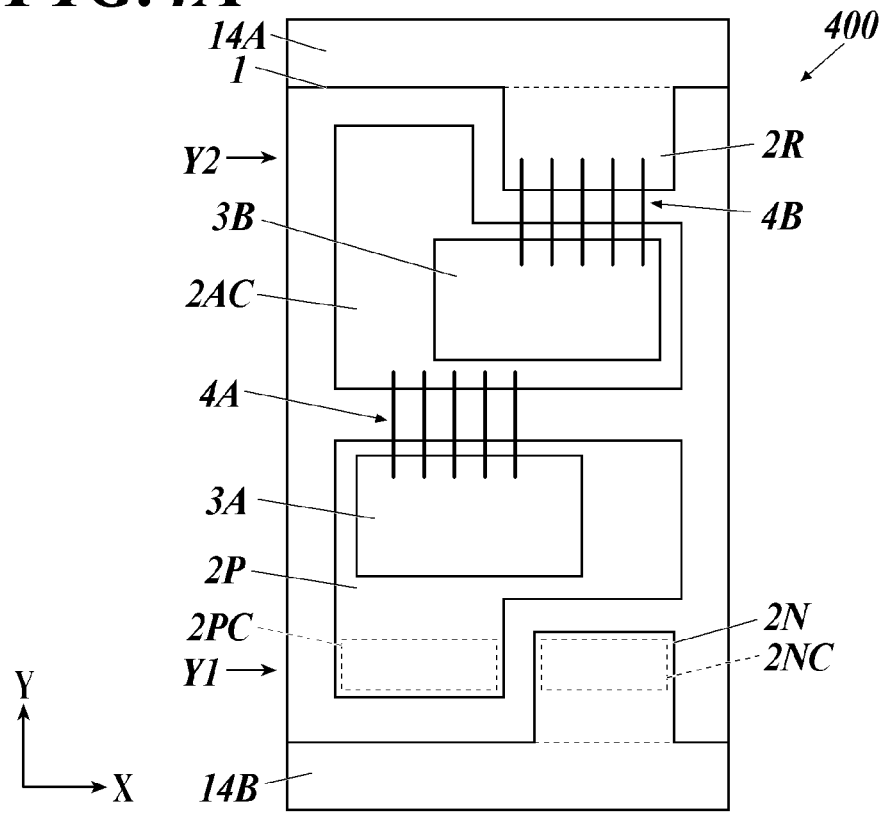
FIG. 4A is a plan view of a circuit board of a power semiconductor module according to another modified embodiment of the present disclosure.
Figure 4B:
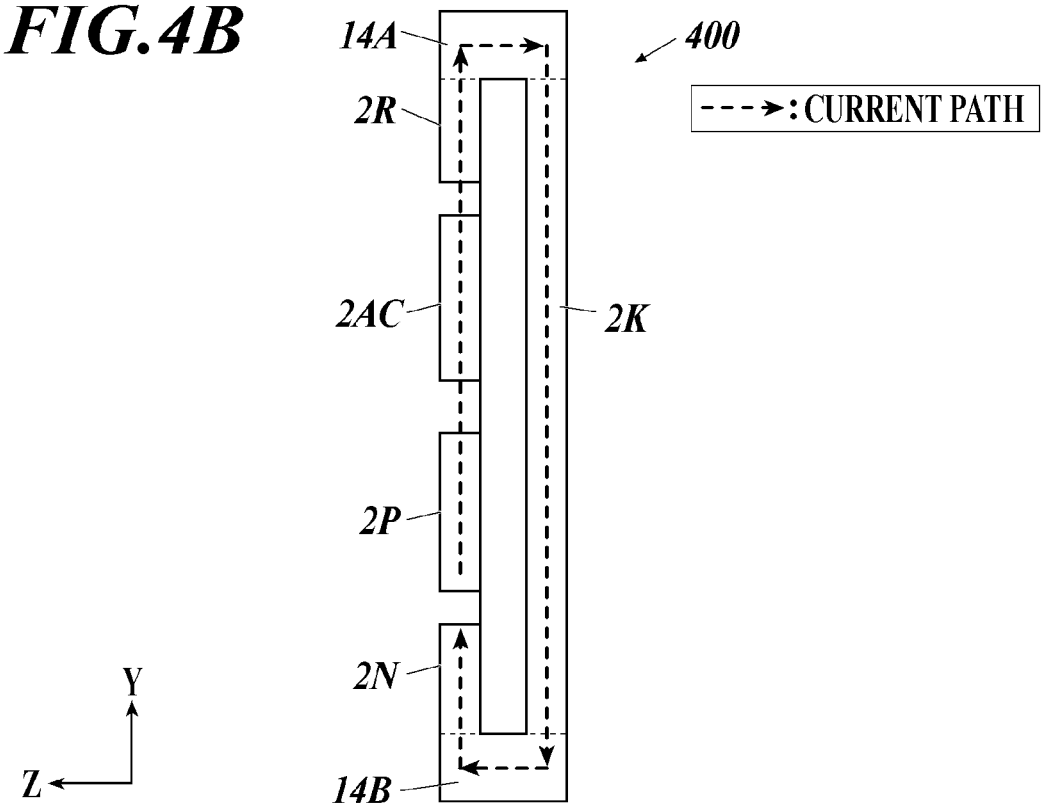
FIG. 4B is a side view of the circuit board of the power semiconductor module according to the modified embodiment of the present disclosure.

A power semiconductor module 400 shown in FIG. 4A and FIG. 4B is configured by using attaching conductors 14A, 14B that are attached to the edge of the insulating substrate 1 as the conductive materials that connect the front and the back of the insulating substrate 1. For example, the attaching conductors 14A, 14B can be set at the edge of the insulating substrate 1 by a method of application, pasting or the like, or can be obtained by cutting, along the center lines of the through holes 5A, 5B shown in FIG. 1B or FIG. 2B, the conductive materials 6A, 6B disposed in the through holes 5A, 5B and the insulating substrate 1. Their manufacturing method is, however, not particularly limited.

Figure 5:
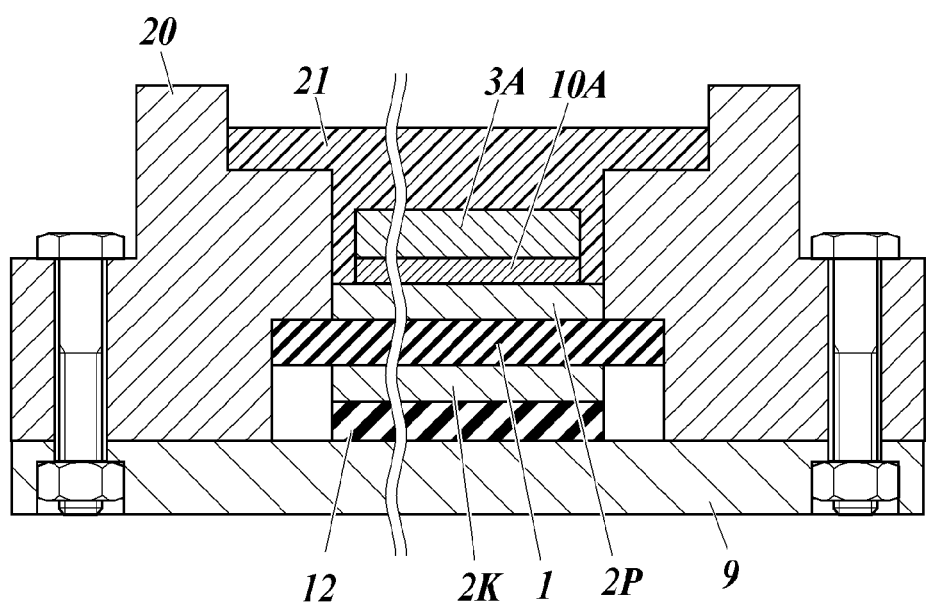
FIG. 5 is a cross-sectional view of a power semiconductor module according to a complementary embodiment of the present disclosure.

A connecting/fixing structure of the circuit and the heat-dissipating metal(s) in the above embodiments and an encapsulating structure of the circuit can be carried out, as they are often carried out, by shaping a frame-shaped resin case 20 shown in FIG. 5 into a container along the outer peripheral edge of the heat-dissipating metal (9) and filling the inside with encapsulation resin 21. A lid may be put on the upper surface. FIG. 5 shows an instance of the second embodiment.

The insulating substrate 1 is fastened to the resin case 20, and the resin case 20 and the heat-dissipating fin component 9 are fastened with bolts in the Z direction, so that a suitable contact pressure is applied to the above-described insulating layer (high thermal conductive resin material) 12, and thermal conductivity at the contact interface is ensured. This is merely an example, and hence the fixing means in the state where a pressure is applied between the insulating substrate 1 and the heat-dissipating metal (9) is not limited thereto.

INDUSTRIAL APPLICABILITY

The present disclosure is applicable to a power semiconductor module.

REFERENCE SIGNS LIST

1 Insulating Substrate
2P, 2N, 2AC, 2R Conductor Pattern
2K Conductor Pattern
2NC Cathode Terminal Connection Portion
2PC Anode Terminal Connection Portion
3A, 3B Power Semiconductor Element
4A, 4B Bonding Wire
5A, 5B Through Hole
6A, 6B Conductive Material
7 Connecting Insulating Substrate
7A, 7B Conductor Pattern
8 Metal Plate
9 Heat-dissipating Fin Component
10A Conductive Adhesive
10B Conductive Adhesive
10C Adhesive
11 Thermal Grease
12 Insulating Layer (High Thermal Conductive Resin Material)
13A, 13B Bonding Wire
14A, 14B Attaching Conductor
20 Resin Case
100 Power Semiconductor Module (First Embodiment)
200 Power Semiconductor Module (Second Embodiment)
Y Long-side Direction
Y1 One End
Y2 Opposite End

The invention claimed is:

1. A power semiconductor module comprising:
an insulating substrate having a first surface and a second surface that opposes the first surface;
conductor patterns formed on the insulating substrate, wherein the conductor patterns include an upper conductor pattern formed on the first surface of the insulating substrate and a lower conductor pattern formed on the second surface of the insulating substrate and the upper conductor pattern includes an anode terminal connection portion and a cathode terminal connection portion;

a power semiconductor element mounted on the upper conductor pattern; and a circuit formed on the first surface and the second surface such that a current that flows between the anode terminal connection portion and the cathode terminal connection portion via the power semiconductor element flows in a first direction along the upper conductor pattern and a second direction along the lower conductor pattern, wherein the first direction and the second direction are opposite directions.

2. A power semiconductor module comprising:

an insulating substrate having a first surface and a second surface that opposes the first surface;

conductor patterns formed the insulating substrate, wherein the conductor patterns include an upper conductor pattern formed on the first surface of the insulating substrate and a lower conductor pattern formed on the second surface of the insulating substrate;

a power semiconductor element mounted on the upper conductor pattern;

an anode terminal connection portion and a cathode terminal connection portion disposed at one end of the insulating substrate on the first surface; and a circuit formed on the first surface and the second surface such that a current that flows between the anode terminal connection portion and the cathode terminal connection portion via the power semiconductor element flows along the first surface in a first direction, and reaches the second surface by turning at an end opposite to the one end, thereby flowing along the second surface in a second direction, wherein the first direction and the second direction are opposite directions.

3. The power semiconductor module according to claim 2, wherein the insulating substrate is a rectangle with the one end as a short side.

4. The power semiconductor module according to claim 1, further comprising a heat-dissipating metal that is coupled to the lower conductor pattern via an insulating layer.

5. The power semiconductor module according to claim 4, wherein the insulating layer is a high thermal conductive resin material.

6. The power semiconductor module according to claim 4, wherein the heat-dissipating metal is a heat-dissipating fin component.

7. The power semiconductor module according to claim 1, wherein a through hole is formed in the insulating substrate, and the conductor patterns are electrically connected to one another via a conductive material disposed in the through hole.

8. The power semiconductor module according to claim 1, wherein the conductor patterns are electrically connected to one another via a conductive material disposed outside an edge of the insulating substrate.

9. A power semiconductor module comprising:

an insulating substrate having a first surface and a second surface that opposes the first surface;

conductor patterns formed on the insulating substrate, wherein the conductor patterns include an upper conductor pattern formed on the first surface of the insulating substrate and a lower conductor pattern formed on the second surface of the insulating substrate;

a power semiconductor element mounted on the upper conductor pattern; and a heat-dissipating metal that is coupled to the lower conductor pattern via an insulating layer; and a circuit formed on the first surface and the second surface such that a current flows in a first direction along the upper conductor pattern and a second direction along the lower conductor pattern, wherein the first direction and the second direction are opposite directions.

10. The power semiconductor module according to claim 9, wherein the insulating layer is a high thermal conductive resin material.

11. The power semiconductor module according to claim 9, wherein the heat-dissipating metal is a heat-dissipating fin component.

* * * * *